United States Patent
Bellorado et al.

(10) Patent No.: US 8,713,413 B1
(45) Date of Patent: Apr. 29, 2014

(54) GENERATION OF INTERPOLATED SAMPLES FOR DECISION BASED DECODING

(75) Inventors: Jason Bellorado, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 312 days.

(21) Appl. No.: 13/022,025

(22) Filed: Feb. 7, 2011

Related U.S. Application Data

(60) Provisional application No. 61/337,605, filed on Feb. 9, 2010.

(51) Int. Cl.
*H03M 13/00* (2006.01)

(52) U.S. Cl.
USPC .......................................... 714/780; 714/760

(58) Field of Classification Search
None
See application file for complete search history.

(56) References Cited

U.S. PATENT DOCUMENTS

| | | | |
|---|---|---|---|
| 7,123,433 B1 * | 10/2006 | Melrose et al. | 360/77.04 |
| 7,155,654 B2 * | 12/2006 | Chien et al. | 714/747 |
| 8,121,219 B1 * | 2/2012 | Bellorado et al. | 375/316 |
| 8,249,197 B2 * | 8/2012 | Bellorado et al. | 375/316 |
| 2001/0053178 A1 * | 12/2001 | Yano et al. | 375/150 |
| 2006/0227596 A1 * | 10/2006 | Thayer | 365/154 |
| 2009/0224866 A1 * | 9/2009 | Glen et al. | 340/3.43 |
| 2010/0128386 A1 * | 5/2010 | Keizer et al. | 360/77.07 |

* cited by examiner

*Primary Examiner* — Daniel McMahon

(74) *Attorney, Agent, or Firm* — Van Pelt, Yi & James LLP

(57) ABSTRACT

A plurality of interpolated samples is generated. Using a plurality of soft-decision detectors, error correction decoding is performed on the plurality of interpolated samples in order to obtain a plurality of decisions. From the plurality of decisions, one is selected by determining which of the plurality of soft-decision detectors are able to come to a decision during error correction decoding. It is determined whether a majority of the detectors that are able to come to a decision come to a same decision. If not, a decision associated with a greatest reliability is selected from the decision detectors that are able to come to a decision.

14 Claims, 4 Drawing Sheets

GENERATION OF INTERPOLATED SAMPLES FOR DECISION BASED DECODING

CROSS REFERENCE TO OTHER APPLICATIONS

This application claims priority to U.S. Provisional Patent Application No. 61/337,605 entitled DETECTION AND ERROR-CORRECTION OF SHORT DATA-FIELDS WITHOUT PHASE SYNCHRONIZATION filed Feb. 9, 2010 which is incorporated herein by reference for all purposes.

BACKGROUND OF THE INVENTION

In storage and communication systems, a read signal (e.g., read back from storage media) or a received signal (e.g., received via a communications channel) is transformed from an analog signal to a digital signal. In order for downstream digital processors in a receiver or a read processor to operate properly, the timing parameters (e.g., frequency and phase) of an analog to digital converter must match that of desired timing parameters. For example, if a random sampling phase is used, at some phases the signal folds back constructively (i.e., increases signal power) whereas at other phases the signal folds back destructively (i.e., decreases signal power) and performance is degraded in the latter case.

Some systems use a closed loop system where there is a feedback path which adjusts the timing parameters of the analog to digital converter. This is often done using a known data portion of a sector or packet, for example a preamble portion and/or synchronization mark portion where the content is known ahead of time. It would be desirable if new techniques could be developed, for example that use simpler processing (which corresponds to a smaller die size and less cost) and/or improve the performance or efficiency of the system.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
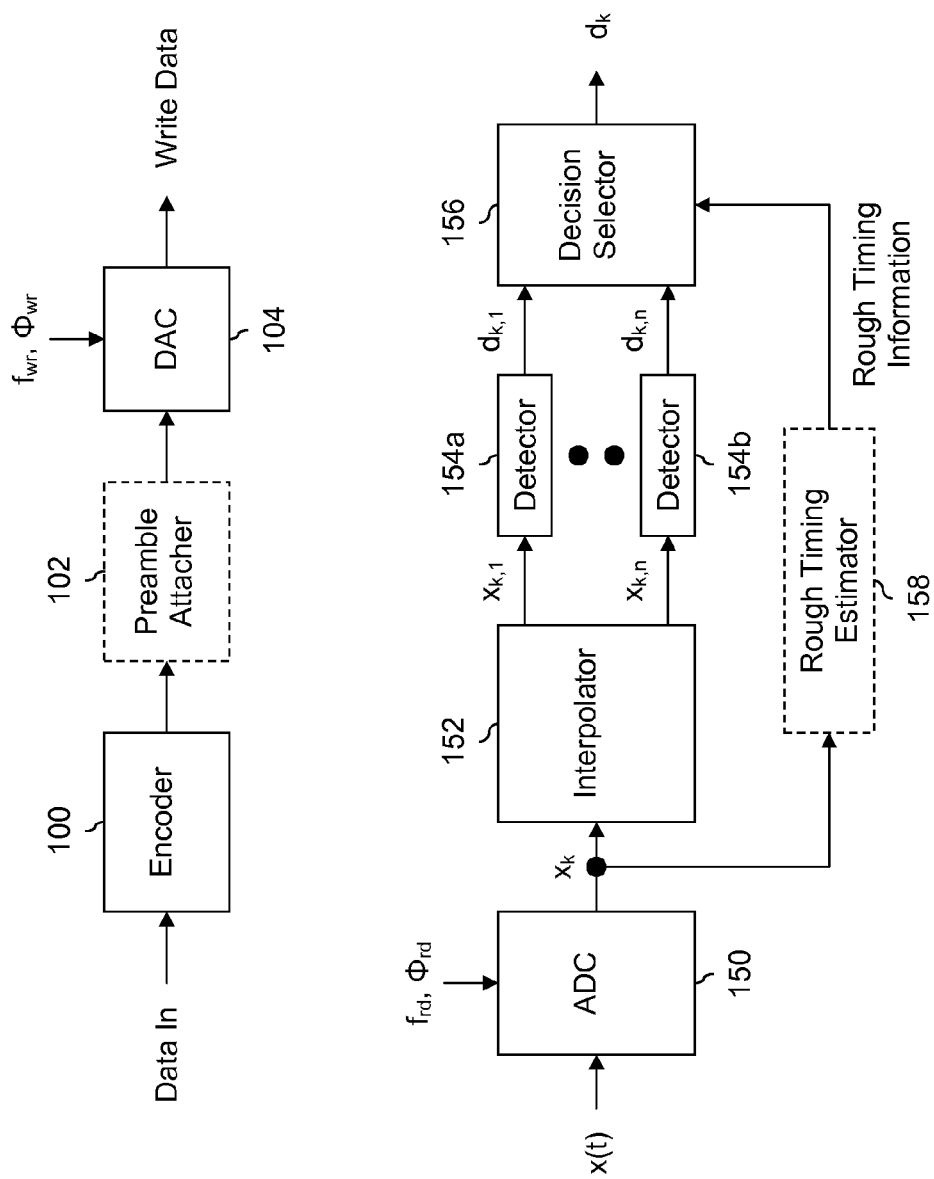
FIG. 1 is a system diagram showing an embodiment of a read processor configured to perform interpolation based processing and a corresponding write processor.

FIG. 1 is a system diagram showing an embodiment of a read processor configured to perform interpolation based processing and a corresponding write processor. In the example shown, the read processor and write processor are used to read data from and write data to storage media (e.g., Flash storage or magnetic disk storage). In some other embodiments, the techniques described herein are used in a communications system and are implemented in a wired or wireless transmitter and/or receiver.

In the example write processor shown, data in is input to encoder 100 which performs error encoding (e.g., error correction encoding or error detection encoding) on the data in to obtain encoded data. Preamble attacher 102 is optional and in some embodiments is not included in a write processor (e.g., if the data written to storage media does not include a preamble). In embodiments which include preamble attacher 102, the encoded data is passed from encoder 100 to preamble attacher 102. A preamble attacher attaches a preamble to the beginning of the encoded data (e.g., for every sector or other "bundle" of information). A preamble has a known or defined sequence and in some embodiments comprises one or more full sine wave cycles (e.g., the bit sequence 1100 repeated as needed). In some embodiments, the preamble that is attached is a relatively short preamble (e.g., one full sine wave cycle which corresponds to the sequence 1100). A short preamble may be desired in applications where the data portion is relatively short since the ratio of payload to overhead improves by quite a bit as the length of the preamble goes down.

The encoded data with a preamble attached is passed to digital to analog converter (DAC) 104 which converts the digital samples to an analog signal using a write frequency ($f_{wr}$) and a write phase ($\Phi_w$). This analog signal is then written to storage media (not shown).

In the example read processor shown, an analog signal x(t) is read back from storage media. The x(t) signal is passed to analog to digital converter 150 which converts the analog signal to digital samples ($x_k$) using a read frequency ($f_{rd}$) and a read phase ($\Phi_{rd}$). In some embodiments, the read frequency ($f_{rd}$) and/or read phase ($\Phi_{rd}$) are set to some expected or nominal frequency (e.g., which matches the write frequency and/or the write phase). In some embodiments, the read frequency and read phase are set once and the same values are used for multiple sectors or other groups of information. In some other embodiments, the read frequency and read phase may be adjusted (if desired) for each new group of information (e.g., for each sector).

ADC 150 outputs digital samples ($x_k$) which are passed to interpolator 152. Interpolator 152 is a 1 to n interpolator which generates n samples at different phase offsets for every 1 sample input to it. Interpolator 152 attempts to replicate the value of the analog signal x(t) at various phase offsets based on the input sample $x_k$. In some embodiments, one of the outputs matches the input (e.g., $x_k$ may match one of $x_{k,1}$ through $x_{k,n}$). An interpolator example is described in further detail below.

Each interpolated sample $x_{k,1}$ through $x_{k,n}$ is passed to a respective detector. Detectors 154a-154b perform the inverse processing of encoder 100 (e.g., error correction decoding or error detection decoding) and are sometimes referred to as decoders. Each detector outputs a decision ($d_{k,1}$ through $d_{k,n}$). A detector will either determine it has been able to perform decoding properly (e.g., a detector decides upon a "1" or a "0") or the detector will determine it cannot perform decoding properly (e.g., the detector cannot come to a decision and raises an error flag or outputs an "X"). The decisions are passed to decision selector 156 which selects one of the decisions to output.

In some embodiments, detectors 154a-154b are hard decision detectors which output a hard decision (i.e., without giving any indication of how confident or certain that detector is in its decision). In some other embodiments, soft decision detectors are used which output reliability information (corresponding to a degree or amount of confidence in the decision) in addition to a decision. In various embodiments, the sign of the output (e.g., positive or negative) indicates the value of the decision (e.g., a "1" versus a "0") and the magnitude of the output expresses the reliability information (e.g., a larger magnitude indicates greater reliability or confidence). In various embodiments a decision and/or reliability information may be in the form of or use non-integer values, logarithmic values, etc.

For clarity, the embodiment of FIG. 1 shows multiple detectors 154a-154b. In some applications, the amount of time permitted for a read processor to complete the processing shown is relatively relaxed. In some such applications a single detector is used (e.g., in place of detectors 154a-154b) which processes all interpolated samples associated with the various phase offsets. For example, during a first period of time, samples associated with the first phase offset (e.g., . . . , $x_{k-1,1}$, $x_{k,1}$, $x_{k+1,1}$, . . . ) are processed by the detector which generates decision(s) for that phase offset. Then, during a second period of time, samples associated with a second phase offset (e.g., . . . , $x_{k-1,2}$, $x_{k,2}$, $x_{k+1,2}$, . . . ) are processed by the detector.

Rough timing estimator 158 is optional and may be used in embodiments which include a preamble or other known data. Rough timing estimator 158 is used to generate rough timing information which is used by decision selector 156 to select one of the decisions to output. Rough timing estimator receives as its input the digital samples ($x_k$) output by ADC 150. For those samples corresponding to the preamble (or other known data portion), a rough timing estimator compares the preamble samples to the expected preamble samples and generates rough timing information. In some embodiments, the rough timing information includes an indicator of how far off the ADC read frequency and/or read phase is from a desired or ideal frequency and/or phase (e.g., $e_f$ or $e_\Phi$). In some embodiments, a rough timing estimator knows the phase offsets for which interpolator 152 will generate samples and the rough timing information identifies which phase offset or corresponding detector is the one that most closely matches a desired or ideal timing. In some embodiments, a rough timing estimator samples a sine wave 4 times per period, producing samples x1, x2, x3, x4. Using the samples, the timing estimator estimates the sampling phase using the equation phase $$= \arctan\left(\frac{x3 - x1}{x4 - x2}\right).$$

In some embodiments, the techniques described herein are used for repeatable runout (RRO) portions of a storage disk. RROs are parts of the disk used to store (in at least some cases) information used to adjust the head position (e.g., radial adjustment). RROs are sprinkled throughout a disk and may follow or fall within a servo wedge. Using the techniques described herein for an RRO may be desirable for a number of reasons. First, the length of an RRO tends to be short and therefore eliminating or significantly reducing a preamble has a significant effect on the ratio of payload to overhead information (e.g., compared to parts of the disk that have much longer data fields). Short data fields also avoid timing issues which arise for relatively packets or sectors when feedback timing loops are not used. As shown in this example, in some embodiments there is no feedback timing loop to adjust the timing of the ADC. For long data fields this can be an issue if the read frequency is not perfect (i.e., equivalent to the write frequency) since the samples will gradually drift if not corrected for using a feedback timing loop. Also, for the type of information stored in RRO, it may be acceptable to have a smaller or simpler design for the circuitry even if it means a less robust design. Other information may be more "mission critical" and/or have very stringent performance requirements where the use of more complex processing and/or a larger die size is an acceptable tradeoff to guarantee a very low error rate. In some embodiments, the techniques described herein are used for other types of data formats or "bundles" (e.g., which have a relatively short data length) besides RROs on a storage disk.

In some embodiments, encoder 100 and detectors 154a-154b work with algebraic codes. Some examples of algebraic codes include Hamming codes, Reed-Solomon codes and BCH codes. A subset of algebraic codes is maximum distance separable (MDS) codes and in some applications MDS codes are attractive because the minimum distance of such codes is at the maximum distance possible. Algebraic and other MDS codes may be attractive in some applications because they are least likely to result in a miscorrection where a detector thinks it has performed decoding properly but has, in fact, come to a decision that is not the proper decision (e.g., the decision does not match the original data to be written or original data to be transmitted as it was prior to encoding). In some applications, cyclic codes (where cyclically shifting causes a last bit or symbol in a sequence to become the first bit or symbol in the sequence) are unattractive because it is desirable for the system to detect when a cyclic shift has occurred, thus avoiding miscorrections. By not using cyclic codes, a cyclic shift would most likely result in a detector declaring an error (i.e., not being able to properly perform decoding) as opposed to a miscorrection.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

Figure 2:
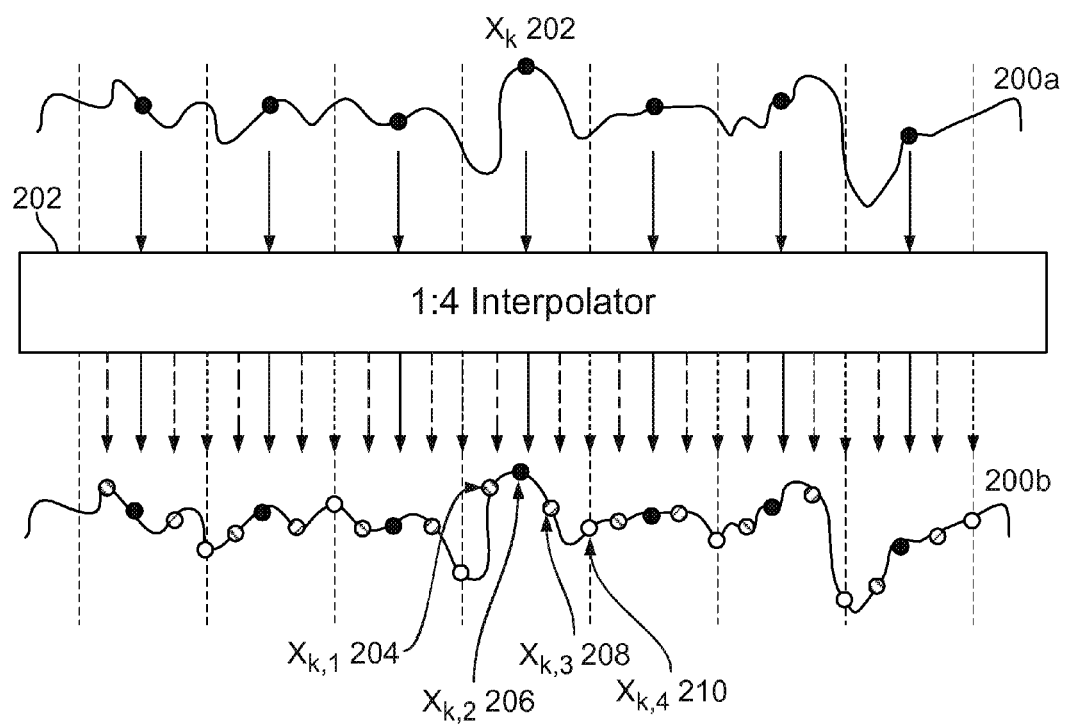
FIG. 2 is a diagram showing an embodiment of interpolation performed by a 1 to 4 interpolator.

FIG. 2 is a diagram showing an embodiment of interpolation performed by a 1 to 4 interpolator. In the example shown, digital samples are obtained from analog signal 200a using an ADC (not shown). The digital samples (such as $x_k$ 202) are passed to interpolator 202. Interpolator 202 is a 1 to 4 interpolator that generates 4 samples at different phase offsets for every 1 sample input to it. For example, interpolated samples 204-210 correspond to input sample 202. In this particular example, the second interpolated sample (i.e., $x_{k,2}$ 206) generated by interpolator 202 matches the input sample $x_k$ 202. In some other embodiments, none of the interpolated samples match the input sample (e.g., the interpolated samples have phase offsets of 45°, 135°, 225° and 315° compared to the input sample).

Using the dashed lines as a reference, the first samples after each dashed line correspond to one group of interpolated samples associated with a first phase offset (e.g., they are all passed to a first detector) the second samples after each dashed line correspond to another group of interpolated samples associated with a second phase offset (e.g., they are all passed to a second detector) and so on.

Figure 3:
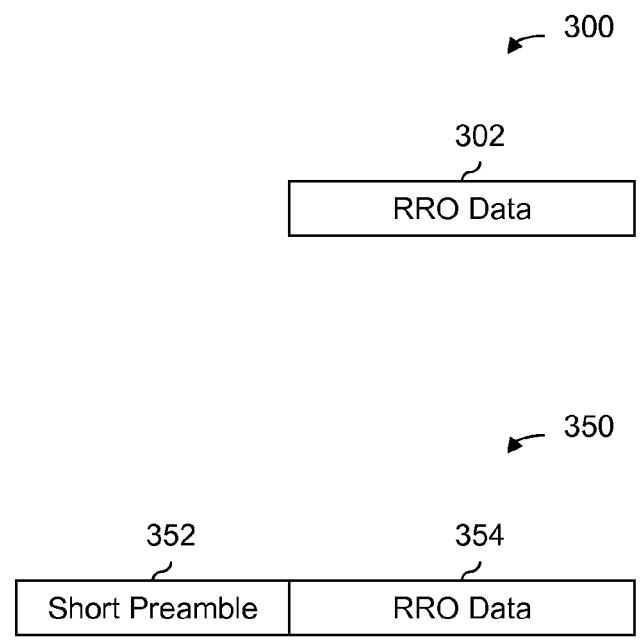
FIG. 3 is a diagram showing embodiments of RRO portions stored on storage media.

FIG. 3 is a diagram showing embodiments of RROs stored on storage media. In the example shown, RRO 300 includes RRO data portion 302 and no preamble. RRO 350 includes a short preamble portion (352) and RRO data portion 354. In some embodiments, short preamble portion 352 has a length that is (e.g., significantly) shortened compared to a regular or nominal preamble. For example, a sector which is used to store application or user data may have a preamble where the bit sequence 1100 is repeated dozens of times (e.g., on the order of 20-40 cycles of preamble), whereas short preamble portion 352 in some embodiments includes the bit sequence 1100 repeated only once or twice.

In some embodiments, there is a synchronization mark portion which precedes a data (e.g., before RRO data portion 302 in RRO 300 and/or before RRO data portion 354 in RRO 350).

In some embodiments, the read processor and write processor shown in FIG. 1 is configured to read from and write to RRO portions, such as the RRO embodiments shown in this figure. Other portions of the disk (e.g., sectors that store application or user data) may be written to and read from using write/read processors other than that shown in FIG. 1 and/or using components or processes not shown in FIG. 1.

Figure 4:
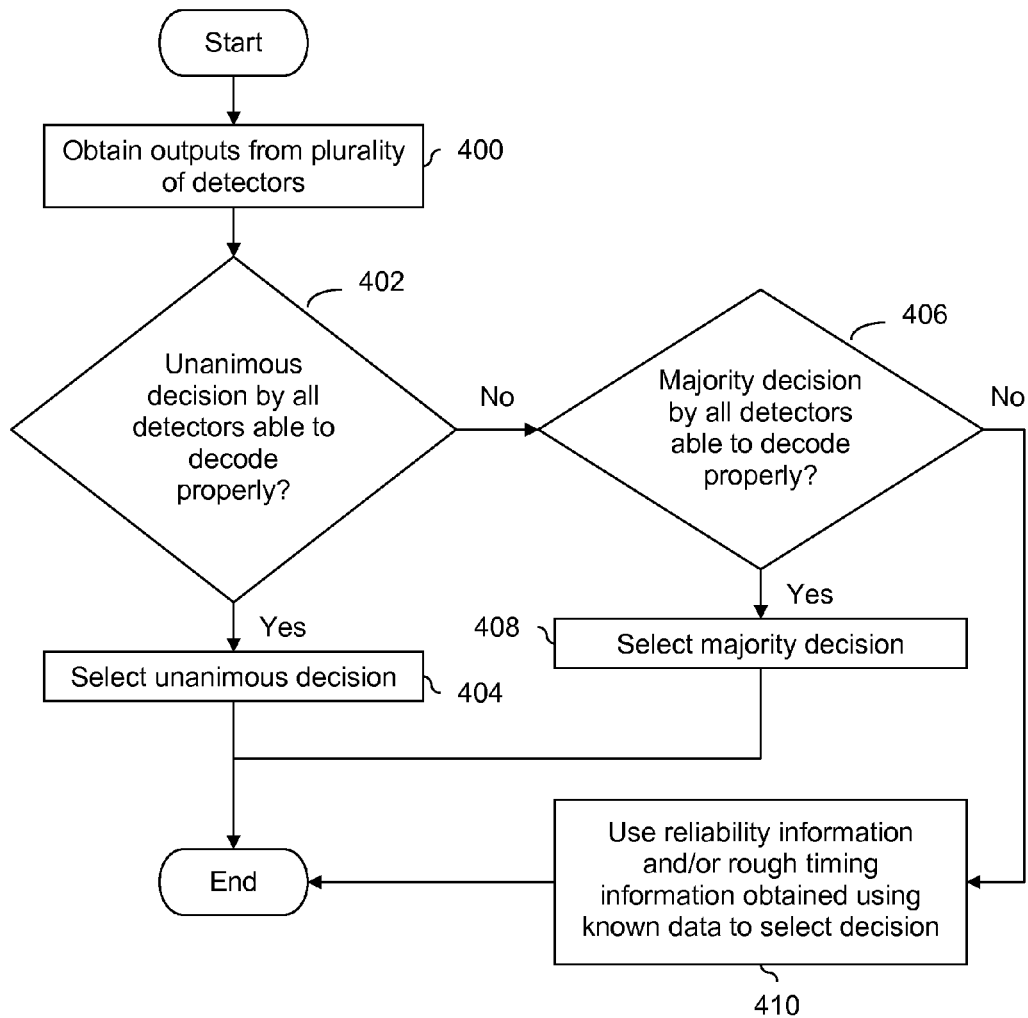
FIG. 4 is a flowchart illustrating an embodiment of a process for selecting a decision.

FIG. 4 is a flowchart illustrating an embodiment of a process for selecting a decision. In some embodiments, a decision selector (e.g., 156 in FIG. 1) performs the example process shown herein. In the example shown, the process first examines the decisions output by a plurality of detectors. If a decision is not able to be selected based on the decisions, then other considerations (in this example, reliability information and/or rough timing information) are used to select a decision to output.

At 400, outputs from a plurality of detectors are obtained. In various embodiments, hard or soft decision detectors are used and therefore a variety of outputs (e.g., hard decisions only in the case of hard detectors or decisions and reliability information in the case of soft decision detectors) may be obtained. At 402 it is determined whether there is a unanimous decision by all detectors which were able to decode properly. If so, the unanimous decision is selected at 404. The table below shows one example of this. In that table, there are 4 (hard) detectors and of them, 3 were able to decode properly. Those 3 detectors (numbered 2-4) all agree on the same decision and a decision of "1" is selected. For clarity, the exemplary detectors associated with this figure are trying to decide between a 0 and 1. In other embodiments, the decision may comprise any type of symbol and/or any (bit) length.

TABLE 1

Example of all detectors able to decode properly agreeing upon a unanimous decision

| | Decision Type | Decision | Rough Timing Information Available? |
|---|---|---|---|
| Detector 1 | Hard | X | No |
| Detector 2 | Hard | 1 | |
| Detector 3 | Hard | 1 | |
| Detector 4 | Hard | 1 | |

If there is no unanimous decision at 402, it is determined whether there is a majority decision by all detectors able to decode properly at 406. If so, the majority decision is selected at 408. See, for example, the table below. Of the 4 (soft) detectors, 3 detectors (numbered 2-4) were able to decode properly and 2 out of those 3 detectors have decided upon a 1 (when mapped to a hard value). A decision of "1" is thus selected, at least in this example.

TABLE 2

Example of all detectors able to decode properly having a majority decision

| | Decision Type | Decision | Rough Timing Information Available? |
|---|---|---|---|
| Detector 1 | Soft | X | No |
| Detector 2 | Soft | 0.8 (1) | |
| Detector 3 | Soft | 0.9 (1) | |
| Detector 4 | Soft | 0.1 (0) | |

If there is no majority decision at 406, reliability information and/or rough timing information obtained using known data is used to select a decision at 410. The table below shows an example where reliability information (for those embodiments that use soft detectors) is used to select a decision. In this example, only the third and fourth detectors were able to decode properly but there was no majority decision since one detector decided in favor of a "0" decision and the other decided in favor of a "1". Since the reliability information for the third and fourth detectors indicates that the third detector is more confident in its decision whereas the fourth detector is less confident in its decision, the "1" decision output by the third detector is selected.

TABLE 3

Example of using reliability information to select a decision

| | Decision Type | Decision | Rough Timing Information Available? |
|---|---|---|---|
| Detector 1 | Soft | X | No |
| Detector 2 | Soft | X | |
| Detector 3 | Soft | 0.9 (1) | |
| Detector 4 | Soft | 0.4 (0) | |

The following table shows an example where rough timing information is used to select a decision (e.g., in those embodiments where there is a preamble or other portion of a sector or packet where the content is known). The detectors in this example all produce hard decisions but there is a preamble from which rough timing is generated. Using a preamble or other known data portion, it is determined that the read frequency ($f_{rd}$) and read phase ($\Phi_{rd}$) of an ADC (e.g., 150 in FIG. 1) are at their desired and/or optimal values and it is also known that the phase associated with the second detector matches the read phase ($\Phi_{rd}$). Based on this information, the decision associated with the second detector is selected (i.e., a "0") since the rough timing information indicates the phase offset (and therefore the decision associated with the second detector) is the closest to an expected or ideal timing.

TABLE 4

Example of using rough timing information to select a decision

| Decision Type | | Decision | Rough Timing Information Available? |
|---|---|---|---|
| Detector 1 | Hard | 1 | $f_{rd}$, $\Phi_{rd}$ are at desired frequency and phase, respectively (i.e., $f_{rd} = f_{wr}$, $\Phi_{rd} = \Phi_{wr}$). Phase associated with detector 2 is the same phase as $\Phi_{rd}$. |
| Detector 2 | Hard | 0 | |
| Detector 3 | Hard | 0 | |
| Detector 4 | Hard | 1 | |

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   an interpolator configured to generate a plurality of interpolated samples;
   a plurality of soft-decision detectors configured to perform error correction decoding on the plurality of interpolated samples in order to obtain a plurality of decisions; and
   a selector configured to select one of the plurality of decisions, including by:
      determining which of the plurality of soft-decision detectors are able to come to a decision during error correction decoding;
      determining whether a majority of the soft-decision detectors that are able to come to a decision during error correction decoding come to a same decision; and
      in the event it is determined a majority does not come to a same decision, selecting, from the soft-decision detectors that are able to come to a decision during error correction decoding, a decision associated with a greatest reliability.

2. The system of claim 1, wherein the system is implemented using one or more of the following: an application-specific integrated circuit (ASIC) or a field-programmable gate array (FPGA).

3. The system of claim 1, wherein the interpolator is configured to generate the plurality of interpolated samples using a plurality of samples associated with a repeatable runout (RRO) stored on storage media, wherein the RRO excludes a preamble.

4. The system of claim 1, wherein the interpolator is configured to generate the plurality of interpolated samples using a plurality of samples associated with a packet received via a communications channel, wherein the packet excludes a preamble.

5. The system of claim 1, wherein the interpolator is configured to generate the plurality of interpolated samples using an input sample and the input sample matches at least one of the plurality of interpolated samples.

6. The system of claim 1, wherein a single detector is configured to perform error decoding on the plurality of interpolated samples in order to obtain a plurality of decisions.

7. The system of claim 1, wherein:
   the interpolator is configured to generate the plurality of interpolated samples using an input sample;
   the system further includes a timing estimator configured to generate timing information using the input sample; and
   the selector is configured to select one of the plurality of decisions based at least in part on the timing information.

8. A method, comprising:
   generating a plurality of interpolated samples;
   using a plurality of soft-decision detectors to perform error correction decoding on the plurality of interpolated samples in order to obtain a plurality of decisions; and
   selecting one of the plurality of decisions, including by:
      determining which of the plurality of soft-decision detectors are able to come to a decision during error correction decoding;
      determining whether a majority of the soft-decision detectors that are able to come to a decision during error correction decoding come to a same decision; and
      in the event it is determined a majority does not come to a same decision, selecting, from the soft-decision detectors that are able to come to a decision during error correction decoding, a decision associated with a greatest reliability.

9. The method of claim 8, wherein the processor is implemented using one or more of the following: an application-specific integrated circuit (ASIC) or a field-programmable gate array (FPGA).

10. The method of claim 8, wherein generating the plurality of interpolated samples includes using a plurality of samples associated with a repeatable runout (RRO) stored on storage media, wherein the RRO excludes a preamble.

11. The method of claim 8, wherein generating the plurality of interpolated samples includes using a plurality of samples associated with a packet received via a communications channel, wherein the packet excludes a preamble.

12. The method of claim 8, wherein generating the plurality of interpolated samples includes using an input sample and the input sample matches at least one of the plurality of interpolated samples.

13. The method of claim 8, wherein:
   generating the plurality of interpolated samples includes using an input sample;
   the method further includes generating timing information using the input sample; and
   selecting one of the plurality of decisions is based at least in part on the timing information.

14. A computer program product, the computer program product being embodied in a non-transitory computer readable storage medium and comprising computer instructions for:
   generating a plurality of interpolated samples;
   using a plurality of soft-decision detectors to perform error decoding on the plurality of interpolated samples in order to obtain a plurality of decisions; and
   selecting one of the plurality of decisions, including by:
      determining which of the plurality of soft-decision detectors are able to come to a decision during error correction decoding;

determining whether a majority of the soft-decision detectors that are able to come to a decision during error correction decoding come to a same decision; and in the event it is determined a majority does not come to a same decision, selecting, from the soft-decision detectors that are able to come to a decision during error correction decoding, a decision associated with a greatest reliability.

* * * * *